(12) United States Patent
Strauss et al.

(10) Patent No.: US 9,690,656 B2
(45) Date of Patent: Jun. 27, 2017

(54) DATA ENCODING ON SINGLE-LEVEL AND VARIABLE MULTI-LEVEL CELL STORAGE

(71) Applicant: Microsoft Technology Licensing, LLC, Redmond, WA (US)

(72) Inventors: Karin Strauss, Seattle, WA (US); Luis Henrique Ceze, Seattle, WA (US); Henrique S. Malvar, Redmond, WA (US); Qing Guo, Rochester, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/633,874

(22) Filed: Feb. 27, 2015

(65) Prior Publication Data

US 2016/0253238 A1    Sep. 1, 2016

(51) Int. Cl.
  *G06F 11/10*    (2006.01)
  *G11C 11/56*   (2006.01)
  (Continued)

(52) U.S. Cl.
  CPC ...... *G06F 11/1072* (2013.01); *G06F 11/1048* (2013.01); *G11C 7/1006* (2013.01);
  (Continued)

(58) Field of Classification Search
  CPC .... G06F 11/1072; G06F 12/00; G06F 12/126; G06F 11/1048; G11C 29/50004;
  (Continued)

(56) References Cited

U.S. PATENT DOCUMENTS 6,012,160 A    1/2000  Dent
6,466,476 B1 *  10/2002  Wong ..................... G11C 11/56
                                                 365/185.03
(Continued)

FOREIGN PATENT DOCUMENTS

NO    2014081860 A2    5/2014
WO    2005089178 A2    9/2005

OTHER PUBLICATIONS

F. Sampaio, M. Shafique, B. Zatt, S. Bampi and J. Henkel, "Approximation-aware Multi-Level Cells STT-RAM cache architecture," Compilers, Architecture and Synthesis for Embedded Systems (CASES), 2015 International Conference on, Amsterdam, 2015, pp. 79-88.*

(Continued)

Primary Examiner — Cynthia Britt
(74) Attorney, Agent, or Firm — Talem IP Law, LLP

(57) ABSTRACT

A method of encoding data on single level or variable multi-level cell storage includes receiving a block of encoded data from an approximation-aware application and at least an importance attribute associated with the block of encoded data; and assigning the block of encoded data to a memory address or a particular region of a memory having at least three precision levels, based at least according to the importance attribute. The importance attribute indicates a relative sensitivity of bits of the block to errors in an output quality from decoding the encoded data. An approximation-aware application can be an image encoding application having a modified entropy encoding step that enables identification and splitting of bits into groupings according to sensitivity to errors.

19 Claims, 9 Drawing Sheets

(51) Int. Cl.

| | | |
|---|---|---|
| *G11C 13/00* | (2006.01) | |
| *G11C 29/42* | (2006.01) | |
| *G11C 29/50* | (2006.01) | |
| *G11C 7/10* | (2006.01) | |
| *H04N 19/60* | (2014.01) | |
| *H04N 19/37* | (2014.01) | |
| *H04N 19/48* | (2014.01) | |
| *H04N 19/423* | (2014.01) | |
| *H04N 19/66* | (2014.01) | |
| *H04N 19/67* | (2014.01) | |
| *G11C 29/04* | (2006.01) | |

(52) U.S. Cl.
CPC ...... *G11C 11/5628* (2013.01); *G11C 11/5678* (2013.01); *G11C 13/0004* (2013.01); *G11C 29/42* (2013.01); *G11C 29/50004* (2013.01); *H04N 19/37* (2014.11); *H04N 19/423* (2014.11); *H04N 19/48* (2014.11); *H04N 19/60* (2014.11); *H04N 19/66* (2014.11); *H04N 19/67* (2014.11); *G11C 2029/0411* (2013.01); *G11C 2029/5004* (2013.01); *G11C 2211/5641* (2013.01)

(58) Field of Classification Search
CPC . G11C 13/0004; G11C 29/42; G11C 11/5678; G11C 2029/5004; G11C 11/56; G11C 11/5628; G11C 7/1006; G11C 2029/0411; G11C 2211/5641; H04N 19/61; H04N 19/48; H04N 19/423; H04N 19/37; H04N 19/60; H04N 19/66; H04N 19/67
See application file for complete search history.

(56) References Cited

U.S. PATENT DOCUMENTS

| | | | | |
|---|---|---|---|---|
| 6,477,201 | B1* | 11/2002 | Wine | H04N 19/172 375/240.08 |
| 6,558,967 | B1 | 5/2003 | Wong | |
| 6,643,169 | B2* | 11/2003 | Rudelic | G11C 11/56 365/185.03 |
| 6,879,521 | B2 | 4/2005 | Furuyama | |
| 7,460,398 | B1* | 12/2008 | Roohparvar | G11C 11/5628 365/185.03 |
| 7,502,518 | B2* | 3/2009 | Noda | H04N 19/176 382/232 |
| 7,660,154 | B2 | 2/2010 | Wang | |
| 8,140,746 | B2 | 3/2012 | Trichina et al. | |
| 8,239,735 | B2 | 8/2012 | Shalvi et al. | |
| 8,259,497 | B2 | 9/2012 | Shalvi et al. | |
| 8,327,246 | B2* | 12/2012 | Weingarten | G06F 11/1072 714/790 |
| 8,332,696 | B2* | 12/2012 | Zeng | G11C 16/3404 714/723 |
| 8,547,745 | B1* | 10/2013 | Asnaashari | G06F 3/0643 365/158 |
| 8,627,165 | B2 | 1/2014 | Liikanen et al. | |
| 8,656,258 | B2 | 2/2014 | Kim et al. | |
| 8,665,642 | B2* | 3/2014 | Rychlik | G11C 11/5628 365/185.03 |
| 8,670,274 | B2 | 3/2014 | Winter et al. | |
| 8,675,139 | B2* | 3/2014 | Park | H01L 27/0207 348/714 |
| 8,699,266 | B2 | 4/2014 | Bandic et al. | |
| 8,861,270 | B2 | 10/2014 | Strauss et al. | |
| 9,021,313 | B2* | 4/2015 | Strauss | G06F 17/10 714/47.1 |
| 2005/0273548 | A1* | 12/2005 | Roohparvar | G11C 11/5621 711/103 |
| 2008/0189481 | A1 | 8/2008 | Mayer et al. | |
| 2009/0019321 | A1* | 1/2009 | Radke | G11C 11/56 714/54 |
| 2009/0241006 | A1 | 9/2009 | Liikanen et al. | |
| 2009/0287969 | A1 | 11/2009 | White et al. | |
| 2010/0070799 | A1* | 3/2010 | Cornwell | G11C 11/5628 714/5.1 |
| 2011/0176590 | A1 | 7/2011 | Banerjee et al. | |
| 2012/0144111 | A1* | 6/2012 | Weber | G06F 12/00 711/114 |
| 2012/0243311 | A1 | 9/2012 | Chen et al. | |
| 2013/0024605 | A1 | 1/2013 | Sharon et al. | |
| 2013/0046803 | A1* | 2/2013 | Parmar | G09G 3/2048 708/203 |
| 2013/0170559 | A1* | 7/2013 | Schink | H04N 19/107 375/240.25 |
| 2014/0143780 | A1 | 5/2014 | Strauss et al. | |
| 2014/0219001 | A1* | 8/2014 | Patapoutian | G11C 13/0002 365/148 |
| 2014/0258593 | A1 | 9/2014 | Strauss et al. | |

OTHER PUBLICATIONS

Zhou, et al., "Error-Correcting Schemes with Dynamic Thresholds in Nonvolatile Memories", In Proceedings of IEEE International Symposium on Information Theory Proceedings, Jul. 31, 2011, pp. 2109-2113.

Ielmini, et al., "Physical Interpretation, Modeling and Impact on Phase change Memory (PCM) Reliability of Resistance Drift due to Chalcogenide Structural Relaxation", In IEEE International Electron Devices Meeting, Dec. 10, 2007, pp. 939-942.

Li, et al., "Improving Multi-Level NAND Flash Memory Storage Reliability Using Concatenated BCH-TCM Coding", In IEEE Transactions on Very Large Scale Integration (VLSI) Systems, vol. 18, No. 10, Oct. 2010, pp. 1412-1420.

Awasthi, et al., "Efficient Scrub Mechanisms for Error-Prone Emerging Memories", In Proceedings of the IEEE 18th International Symposium on High-Performance Computer Architecture, Feb. 25, 2012, 12 pages.

Azevedoy, et al., "Zombie Memory: Extending Memory Lifetime by Reviving Dead Blocks", In Proceedings of the 40th Annual International Symposium on Computer Architecture, Jun. 23, 2013, 12 pages.

Beaver, et al., "Finding a needle in Haystack: Facebook's photo storage", In Proceedings of the 9th USENIX conference on Operating systems design and implementation Article No. 1-8, Oct. 4, 2010, 14 pages.

Dufaux, et al., "The JPEG XR image coding standard", In IEEE Signal Processing Magazine, vol. 26, No. 6, Nov. 2009, 6 pages.

Gastpar, et al., "Source-channel communication in sensor networks", In Proceedings of the 2nd international conference on Information processing in sensor networks, Apr. 22, 2003, 16 pages.

Holcomb, et al., "Qbf-based synthesis of optimal word-splitting in approximate multi-level storage cells", In Workshop on Approximate Computing Across the System Stack, Mar. 2014, 7 pages.

Ielmini, et al., "Recovery and drift dynamics of resistance and threshold voltages in phase-change memories", In IEEE Transactions on Electron Devices vol. 54, Issue 2, Feb. 2007, 8 pages.

Malvar, Henrique S. "Signal Processing with Lapped Transforms", In Book of Artech House Telecommunications Library, Jan. 1, 1992, 3 pages.

Malvar, Henrique S. "Fast progressive wavelet coding", In Proceedings of the Conference on Data Compression, Mar. 29, 1999, 8 pages.

Malvar, Henrique S. "Fast progressive image coding without wavelets", In Proceeding of Data Compression Conference, Mar. 2000, 10 pages.

Malvar, Henrique S. "Adaptive run-length / golomb-rice encoding of quantized generalized gaussian sources with unknown statistics", In Proceedings of Data Compression Conference, Mar. 2006, 10 pages.

Pennebaker, et al., "JPEG: Still image data compression standard", Published on: Dec. 31, 1992 Available at: http://www.amazon.com/JPEG-Compression-Standard-Multimedia-Standards/dp/0442012721.

(56) References Cited

OTHER PUBLICATIONS

Sala, et al., "Dynamic threshold schemes for multi-level non-volatile memories", In IEEE Transactions on Communications, vol. 61, No. 7, Jul. 2013, 11 pages.
Sampson, et al., "Approximate storage in solid-state memories", In Proceedings of the 46th Annual IEEE/ACM International Symposium on Microarchitecture, Dec. 7, 2013, 12 pages.
Schwartz, et al., "Bit-plane encoding: A technique for source encoding", In IEEE Transactions on Aerospace and Electronic Systems, Jul. 1996, 8 pages.
Seong, et al., "Trilevel-cell phase change memory: Toward an efficient and reliable memory system", In Proceedings of the 40th Annual International Symposium on Computer Architecture, Jun. 23, 2013, 12 pages.
Vembu, et al., "The source-channel separation theorem revisited", In IEEE Transactions on Information Theory, vol. 41, No. 1, Jan. 1995, 11 pages.
"Second Written Opinion Issued in PCT Application No. PCT/US2016/016672", Mailed Date: Feb. 1, 2017, 7 Pages.
"International Search Report and Written Opinion Issued in PCT Application No. PCT/US2016/016672", Mailed Date: Sep. 22, 2016, 24 Pages.
Roh, et al., "Data Partitioning and Coding of DCT Coefficients Based on Requantization for Error-Resilient Transmission of Video", In Proceedings of the Signal Processing, Image Communication, vol. 17, Issue 8, Sep. 1, 2002, pp. 573-585.
Guo, et al., "High-Density Image Storage Using Approximate Memory Cells", In Proceedings of the Twenty-First International Conference on Architectural Support for Programming Languages and Operating Systems, Mar. 25, 2016, pp. 413-426.
Yoon, et al., "Practical Nonvolatile Multilevel-Cell Phase Change Memory", In Proceedings of the SC-International Conference for High Performance Computing, Networking, Storage and Analysis (SC), Nov. 17, 2013, pp. 1-12.

* cited by examiner

 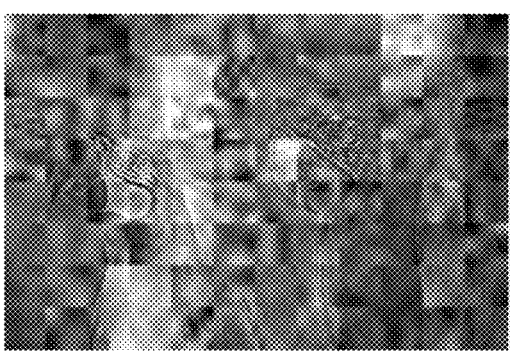
FIG. 1A                    FIG. 1B
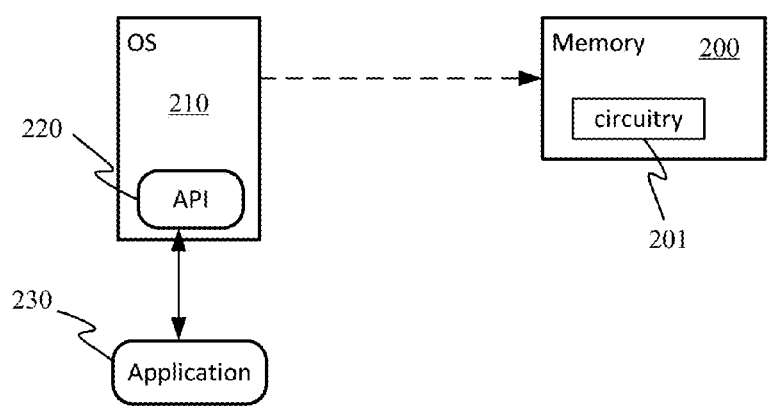
FIG. 2

| Level | Data | $\log k_r$ | | $\log k_s$ | | $\mu(v)$ | | $\sigma(v)$ | Write BER | | Drift BER | |
|---|---|---|---|---|---|---|---|---|---|---|---|---|
| | | a | b | a | b | a | b | | a | b | a | b |
| 0 | 10 | 3.00 | 3.00 | 3.58 | 3.35 | 0.001 | 0.001 | 0.4μ(v) | very low | 2.5E−6 | very low | very low |
| 1 | 11 | 4.17 | 3.68 | 4.75 | 4.27 | 0.027 | 0.012 | | | | very low | very low |
| 2 | 01 | 5.33 | 4.52 | 5.92 | 6.25 | 0.073 | 0.040 | | | | 0.3656 | very low |
| 3 | 00 | 6.50 | 6.50 | — | — | 0.120 | 0.120 | | | | — | — |

| Level | Data | $\log k_r$ | | $\log k_s$ | | $\mu(v)$ | | $\sigma(v)$ | Write BER | | Drift BER | |
|---|---|---|---|---|---|---|---|---|---|---|---|---|
| | | a | b | a | b | a | b | | a | b | a | b |
| 0 | 100 | 3.00 | 3.00 | 3.25 | 3.14 | 0.001 | 0.001 | 0.2μ(v) | 5.6E−14 | 5.6E−6 | very low | very low |
| 1 | 101 | 3.50 | 3.28 | 3.75 | 3.44 | 0.010 | 0.006 | | | | very low | 0.0005 |
| 2 | 111 | 4.00 | 3.58 | 4.25 | 3.73 | 0.020 | 0.012 | | | | 0.0058 | 0.0040 |
| 3 | 110 | 4.50 | 3.90 | 4.75 | 4.12 | 0.040 | 0.018 | | | | 0.6774 | 0.0042 |
| 4 | 010 | 5.00 | 4.28 | 5.25 | 4.62 | 0.080 | 0.031 | | | | 0.9700 | 0.0043 |
| 5 | 011 | 5.50 | 4.78 | 5.75 | 5.33 | 0.100 | 0.051 | | | | 0.9960 | 0.0044 |
| 6 | 001 | 6.08 | 5.47 | 6.25 | 6.36 | 0.109 | 0.080 | | | | 0.9991 | 0.0045 |
| 7 | 000 | 6.50 | 6.50 | — | — | 0.120 | 0.120 | | | | — | — |

DATA ENCODING ON SINGLE-LEVEL AND VARIABLE MULTI-LEVEL CELL STORAGE

BACKGROUND

Memory and storage often have various tradeoffs between precision (errors), endurance, performance, energy efficiency, and density (capacity). Single-level cell (SLC) memories, such as dynamic random access memory (DRAM) and some forms of Flash, store one bit of data in each cell. To provide higher density, multi-level cell (MLC) memory, such as available with Flash and phase-change memory (PCM), subdivides the range of values in a cell into a larger number of levels to store more than one bit of data. For example, Flash represents values in the threshold voltage of a memory cell and PCM represents values in the resistance of the memory cell. Accordingly, for certain multi-level storage, the larger the resistance range allowed by the cell, the higher the number of levels that can be used in the cell to store information, making the cell denser from a storage perspective. That is, the cell is able to store more information per unit of physical volume. However, with respect to the tradeoffs, there are limitations on how dense a cell can be made while still being cheap and reliable.

In addition, the denser the cell, the more precise the write and read machinery needs to be to preserve the same error rate. For example, for a fixed resistance range, using a higher number of levels requires more precise hardware to write and read these cells correctly every time. More precise hardware means higher costs; and, for the same hardware, storing a higher number of levels in a cell incurs a higher read and write error rate. Other resistance-changing processes such as drift in PCM also affect the read error rate.

Cloud servers and mobile devices, as well as other computing devices used to store increasing quantities of data, benefit from denser storage. For example, images and pictures consume a significant portion of storage space in consumer devices and the cloud. Compression techniques may be used by some applications to reduce the amount of data that needs to be stored. Often error correction techniques are used to mitigate the effect of hard and soft errors by hiding the errors from an application. However, with fewer bits representing an image or other file when using compressed file formats, errors may be amplified when the data is output and decompressed.

BRIEF SUMMARY

Techniques and systems are described herein that enable applications and operating systems to take advantage of relaxing the error requirements of a region in memory of a storage device in exchange for increased capacity, endurance, performance, energy efficiency or other property of the storage device while still being able to maintain suitable output quality for the data.

A method of encoding data on a single level or variable multi-level cell storage can include receiving a block of encoded data from an application and at least an importance attribute associated with the block of encoded data; and assigning the block of encoded data to a memory address or a particular region of a memory having at least two levels, based at least according to the importance attribute. Here, the importance attribute indicates a relative sensitivity of bits of the block to errors in an output quality from decoding the encoded data. In some cases, an operating system or a file system can perform aspects of this method.

An approximation aware algorithm is also described that can identify at least two levels of output quality importance for output data bits, and partition the output data bits according to their identified output quality importance level. The approximation aware algorithm can, in some cases when accessing an application programming interface of an operating system or a file system that can encode data on a single level or variable multi-level cell storage, indicate the appropriate importance attribute with the output quality importance level.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 1A and 1B show an encoded image before (FIG. 1A) and after (FIG. 1B) storing the encoded image into approximate storage without storage precision.

FIG. 2 illustrates a memory system for programmable storage precision.

DETAILED DESCRIPTION

Figure 3A:
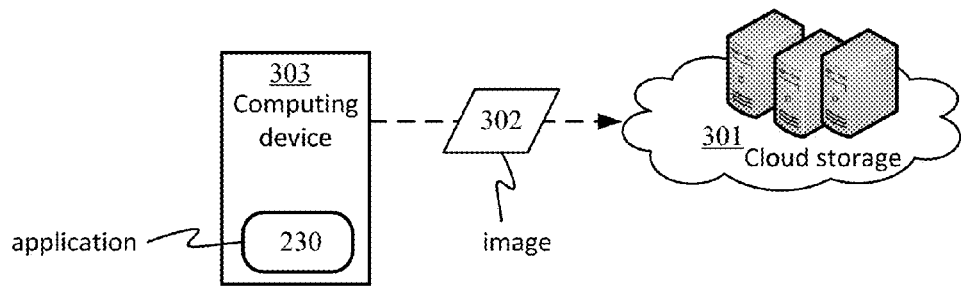
FIGS. 3A-3C illustrate various operating environments and corresponding storage locations.

Techniques and systems are described herein that enable applications and operating systems to take advantage of relaxing the error requirements of a region in memory of a storage device in exchange for increased capacity, endurance, performance, energy efficiency or other property of the storage device while still being able to maintain suitable output quality for the data.

The described techniques are suitable for any encoded data where certain bits are more important to decoder output quality than others. Such applications include image, audio, video and text encoding, for example JPEG, JPEG XR, JPEG 2000, and WebP for images, high efficiency video coding (HEVC) for video, and WMA and MPEG-2 Layer III (MP3) for audio.

For any of these applications, the encoding algorithm is modified to assign bits to different categories. That is, as part of the encoding process, the algorithm is designed to recognize different categories of bits based on their relative effect on output quality should the bit contain an error. This can be referred to as being "approximation-aware." The "approximation awareness" stems from "approximate storage," which refers to a memory optimization technique where it is possible to indicate that certain objects may be stored in memory having a higher likelihood of errors. These regions of memory having a higher likelihood of errors are not necessarily regions having a high error rate, only that the tolerance or requirement for a particular error rate is relaxed and occasional errors may happen. Advantageously, a relaxed error constraint for a memory region may also contribute to additional capacity for storing the data, particularly for applications that do not require, at least for some data, the precision that conventional memory provides.

The terms "memory" and "storage" are used interchangeably herein and any specific meaning being applied to the term can be understood by its context.

Pictures such as the image of parrots shown in FIG. 1A use most of the storage in mobile devices, and are often uploaded to the cloud, consuming even more space. To save storage, these images are usually compressed to formats such as JPEG, JPEG XR, or JPEG 2000. While such formats already have deterministic quality versus storage space trade-offs via quantization, additional capacity can be achieved by trading occasional non-deterministic errors for higher density. The challenge is that some encoded bits matter more than others for image output quality.

This trade-off is illustrated in FIG. 1B, which shows the result of reading and decode reconstructing the image shown in FIG. 1A 28 seconds after that 40 dB image of parrots shown in FIG. 1A was stored in an unoptimized 8-level approximate cell storage. Despite the improved density (of 3 times) due to the use of 8-level approximate cells, the image was degraded by about 22 dB. Without any cell optimization or error correction, maintaining the image quality (40 dB) at decode time would have required the use of a much higher target quality level (50 dB), which uses a smaller quantization factor at encode time, resulting an almost doubled encoded image size. Alternatively, error correction can be used to protect the image from errors, at the cost of additional storage overheads (e.g., about a third extra storage for BCH-16).

As illustrated by FIGS. 1A and 1B, indiscriminate storage of bits of an encoded image into unoptimized and untuned approximate cells can lead to high image quality at the cost of wasteful overprovisioning of error correction resources (and resulting density loss) or lower storage requirements at the cost of affecting sensitive bits with intolerable error rates (affecting image quality). Through analysis, including the study illustrated in FIGS. 1A and 1B, it was determined that errors in certain types of encoded bits have a different impact on the resulting decoded image. For example, an error in a low frequency coefficient affects the corresponding entire block and may be visible in the final image, making the quality degradation unacceptable in many cases. Therefore, by using an approximation-aware encoding algorithm (and in some cases further using optimized and/or tuned approximate cells), sufficient image quality can be maintained and resources maximized.

An approximation-aware encoding algorithm is optimized when partnered with storage that contains distinct regions having different error constraints. The probability of error for a memory region is referred to herein as "precision," where lower probabilities of error represents a higher precision. That is, a higher precision has a lower error rate. Careful matching of cell error properties with encoded bits via cooperative design of the encoding algorithm with the storage substrate can significantly improve image quality while getting most of the density benefit that approximate storage offers.

FIG. 2 illustrates a memory system for programmable storage precision. The memory 200 can implement a dynamic approximate storage memory by including, for example, circuitry 201 for dynamically changing thresholds of multi-level cell storage such as Flash and PCM. Instead of hard coded thresholds that are tuned for generic behavior, the circuitry 201 for dynamically changing thresholds can implement variable threshold. That is, the thresholds indicating levels for a memory cell can be optimized for a particular application (or data type). For example, asymmetric ranges can be established for different values in a cell. PCM uses resistance values; however, other memories can use other physical characteristics including voltage values.

In addition, in some cases, regions can be allocated with particular error codes. In some of such cases the circuitry 201 may be used to implement variable error correction. That is, the error rate of a cell can be modified using different levels of error correction depending on the error constraint for the region to which the cell belongs. The circuitry 201 may be on-chip or part of a memory controller and include registers, decoding logic, and, optionally, logic for external control of data in the registers.

With an appropriate memory 200, an operating system 210 accessing the memory 200 includes a means to utilize the memory 200. That is, an importance attribute for the level of precision for data is included so that the operating system 210 can indicate to the memory 200 the level of precision associated with certain bits and/or bytes of data. The indication can include a flag. In some cases, the operating system 210 can receive multiple images (or other data) and send the data identified with the same importance levels into the same type of memory cells by, for example, communicating with a memory controller for the memory 200 to indicate the level of precision for a set of bits or bytes. The granularity for levels of precision may be based on available granularity at the memory 200.

The operating system 210 may include the functionality that identifies data type (and corresponding appropriate level of storage precision) for data being stored. In some cases, the operating system 210 can receive an indication of the type of application ("application type") requesting storage of data (which may in some cases be the same as an indication of data type). In addition, or as an alternative, the operating system may expose via an application programming interface (API) 220 the different levels of storage precision so that applications 230 can more easily identify to the operating system 210 whether particular data can be stored in memory cells have relaxed requirements.

The application 230 is created or modified to be able assign the relative prioritization of encoded bits of an image (or some other encoded data) into different error susceptibility (and resulting quality-loss) categories. When communicating with the operating system 210 to store the data in the memory 200, the application 230 requests (or indicates) different levels of precision for its data. Whether already understood by the operating system 210 or via the API 220, the operating system 210 and/or memory controller (of memory 200) then maps the bits in the different error susceptibility categories to different cell categories, according to the cells' expected error rates.

Accordingly an operating environment such as illustrated in FIG. 2 can include one or more memory chips (memory 200) that are programmed by the memory controller (or read/write controller) to have thresholds (and/or error codes) optimized for a particular application 230. The assignment of the particular levels of precision can be performed by the system, but be application and/or scenario dependent. For example, an application 230 that stores images of a certain type, for example, JPEG XR, can use memory 200 with thresholds optimized for storing JPEG XR. In some cases, the operating system 210 and/or memory controller can access profiles (stored in precise memory and/or registers) to obtain system parameters based on the type of application storing data. Users may also be able to specify final qualities of their images.

Figure 3B:
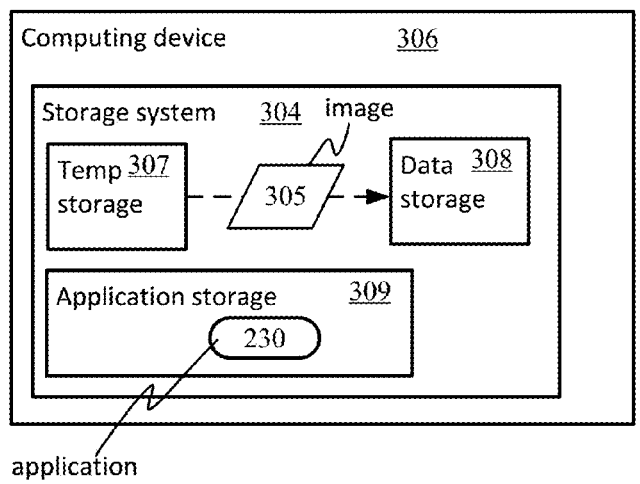
Figure 3C:
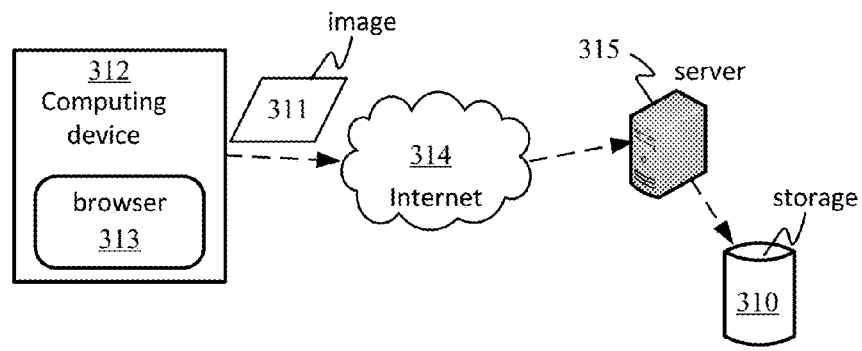

The programmed thresholds may also depend on the location of the storage. FIGS. 3A-3C illustrate various operating environments and corresponding storage locations. For example, as illustrated in FIG. 3A, cloud storage 301 can receive an image 302 from an application 230 executing on a computing device 303. The computing device 303 may be or include one or more of a server, personal computer, mobile device, wearable computer, gaming system, and appliance. One scenario for the operating environment shown in FIG. 3A is a cellphone sending an image 302 to a Microsoft OneDrive® account. The number of programmed thresholds and the particular memory type (e.g., Flash, PCM, etc.) implementing the cloud storage can be selected to be suitable for handling massive amounts of data as common for cloud storage. In one implementation taking advantage of this scenario, the computing device 303 may be a phone that aggressively degrades a copy of the image 302 located on the device the longer the copy has not been accessed. The image 302 may be stored in the cloud storage 301 as a higher quality copy from which the computing device 303 may recover a high quality image.

In the example illustrated in FIG. 3B, the storage 304 receiving the image 305 from the application 230 is a local storage on (or associated with) the device 306 executing the application 230. Continuing with the cellphone example, in this operating environment, the image 305 is stored in the cellphone's memory, for instance by writing the image from temporary storage 307 (such as at the time an image is captured by a camera of the cellphone) to a data storage 308 of the storage 304 of the computing device 306. The application 230 may also be stored in the application storage 309 of storage system 304. In some cases, the data storage 308 and application storage 309 may be part of a same memory chip while the temporary storage 304 is part of a cache that may be separate from or integrated (e.g., on-chip) with a processor of the computing device 306. In some cases, the temporary storage 307 is a region on a same chip as the data storage 308. Of course, the particular configuration is device and technology dependent.

As previously noted, the particular number of programmed thresholds can be based on the capabilities and storage needs of the device 306, which may be one or more of a server, personal computer, mobile device, wearable computer, gaming system, and appliance. In the cellphone example, 20% of the storage 304 may be allocated for the most precise region of memory so that there is sufficient space for application storage 304 and important data; whereas the remaining storage 304 can have higher allowed error rates (e.g., by being more dense or having less bits for error correction).

In the example illustrated in FIG. 3C, the storage 310 can be associated with a website that receives an uploaded image 311 from a computing device 312 (via web browser 313) over the Internet 314 (and stores the image at a server 315 with associated storage 310). Although shown in a separate representation, the example illustrated in FIG. 3C may be carried out in the environment illustrated in FIG. 3A. For example, the website may be hosted by a cloud service and/or the associated storage may be cloud storage. In other cases, designated servers are used to host the website and store associated data. The needs and capabilities of these devices can influence the number of thresholds and the allocation of the amount of storage available at each threshold.

Image encoding algorithms use a variety of steps to reduce the size of a raw image. These algorithms may be lossy or lossless, the most common being lossy (e.g., JPEG). An image encoding algorithm can be specifically tailored for an approximate storage substrate, making it into an approximation-aware encoding algorithm. Furthermore, the approximate storage substrate can be optimized for the data being stored (a dynamic approximate storage substrate). For example, the relative importance of encoded bits can be determined and the encoded bits can be stored in an approximate storage substrate that is tuned to match the error tolerance for the particular encoded bits.

Figure 4A:
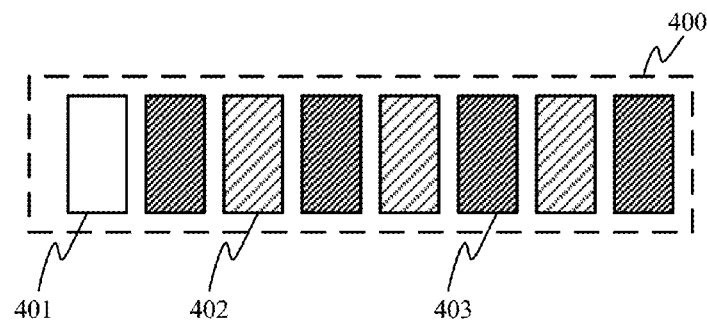
FIGS. 4A-4C illustrate an example implementation of operation of storage precision where data is an encoded image.
Figure 4B:
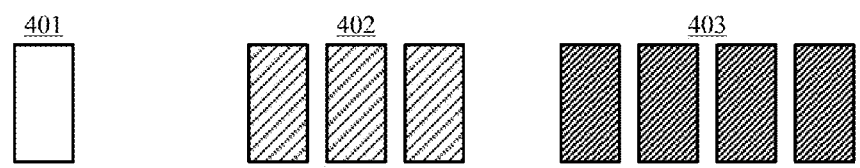
Figure 4C:
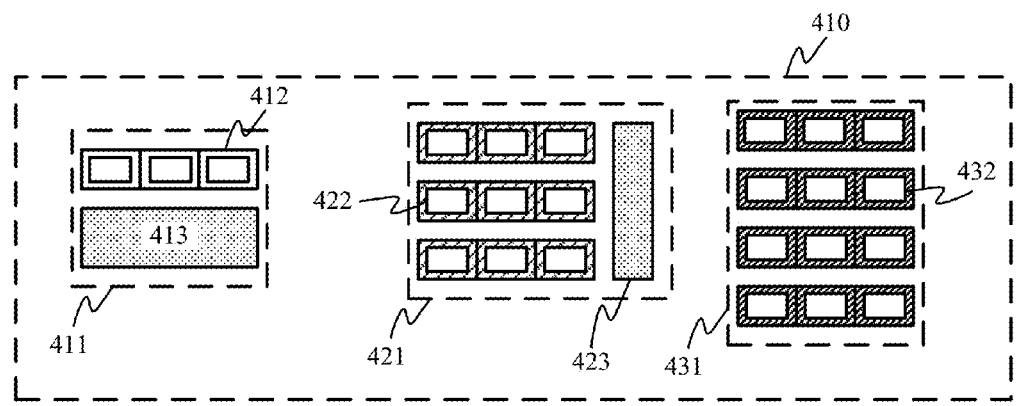

FIGS. 4A-4C illustrate an example implementation of operation of storage precision where the data is an encoded image. It should be understood that the illustrated operation is applicable to other encoded data. Referring to FIG. 4A, an encoded image 400 can include, for example, high importance bits 401, medium importance bits 402 and lower importance bits 403.

An approximation aware encoding application can identify at least two types of bits (or all three types or even more types if higher granularity is desired) and can split (or make it possible to split) these different types of bits into different streams as illustrated in FIG. 4B. An approximate storage substrate includes multiple regions with different allowed levels of precision (or error rates). The bits with similar error tolerances are mapped into the appropriate types of storage. For example, one region may be the most precise, with the lowest likelihood of errors (e.g., $10^{-12}$ errors); and at least one other region is provided that is less precise, with a relaxed error rate. These regions can be hardwired or dynamic (programmed). The difference in error rates may be due to types of error correction applied and/or the density permitted. The inclusion of regions of relaxed error constraints can be identified to programs storing data to the storage.

In FIG. 4C, three types of storage are shown as part of an approximate storage substrate 410. A first type region 411 with lowest error rates can be optimized for high importance bits 401 to include memory cells 412 and error correction cells 413 providing large error correction overhead. A second type region 421 can be optimized for medium importance bits 402 to include cells 422 that are denser than memory cells 412 with moderate error rates and error correction cells 423 providing some error correction overhead. The third region 431 then includes the cells 432 with the highest allowed error rates (optionally optimized for the lower importance bits 403), for example, being the densest memory and having minimal, if any, error correction.

Although three types of regions are shown, in some cases two types of regions may be used; and in some other cases more than three types may be used. The number of types of regions may depend on the particular applications using the memory. In some cases, the number of types are programmable and may be adjusted after manufacturing and even reprogrammed.

Dynamic approximate storage substrate 410 may be any suitable memory storage device including SLC memories and MLC memories. For a MLC memory (or a hybrid memory containing SLC and MLC cells), the first type region 411 may be configured as a single level cell region for storing a single bit (even though in the case of the MLC memory it is capable of multiple levels); the second type region 412 may be configured as a denser region, for example, with three or four-level cells; and the third type region 413 may be configured more densely than the second type region 412, for example, with eight-level (e.g., for 3 bits) or denser cells. For various SLC and MLC implementations, the regions may be assigned different types of error correction (e.g., different error codes and/or number of error correction bits).

The memory cell for each of the regions may be the same type of cell; in such a case, the different regions are obtained by how the values of the cells are interpreted. That is, the reading and writing processes for the multi-level cells can control what type of memory region a cell belongs to. For example, a four-level multi-level cell can be used to store 1 bit or 2 bits (or even 3 bits) by adjusting the thresholds (and even assigning a particular range of resistances).

A case study has been performed to illustrate the described techniques. The case study involved the progressive transform codec (PTC), a precursor to JPEG XR, and a PCM storage substrate. PTC has been used in several practical applications, such as in game texture storage for Microsoft Xbox® games. PTC processes the pixels in an image being encoded through classical steps including time-to-frequency transformation, quantization, coefficient mapping from a 2D array to 1D, and entropy encoding. PTC uses the hierarchical lapped biorthogonal transform (HLBT) instead of the discrete cosine transformation (DCT) or wavelets, a ping-pong style scanning pattern for macroblocks, and adaptive run-length/Golomb-Rice entropy encoding.

For the PTC image encoding algorithm, the PTC image encoding format was analyzed and groups of bits with similar error rate requirements were identified to form error tolerance classes. The PTC encoded image includes bits that can be identified by their frequency coefficients. It has been observed that lower frequency coefficients, typically the highest in value, are also the most important coefficients for image quality. Here, similar to the approach illustrated in FIGS. 4A and 4B, it is possible to group blocks of data according to their frequency coefficients. Thus, in reference to FIGS. 4A and 4B, the blocks identified as 401 correspond to control and run-length bits for the lowest frequency coefficients, the blocks identified as 402 correspond to control and run-length bits for other coefficients, and the blocks identified as 403 correspond to represent refinement bits for all coefficients.

The original PTC algorithm partitions data into macroblocks, which makes it straightforward to direct different macroblocks to different regions of storage. However, for each macroblock, PTC stores control, run-length and refinement bits in the same bitstream. During encoding, refinement bits are already segregated from control and run-length bits and appended at the end of a macroblock. However, the control and run-length bits need to be pulled apart into different bitstreams if they are to be stored into memory regions with different error characteristics. Therefore, a modification to PTC to make it approximation-aware involves identifying and making segregable the control and run length bits of each macroblock.

PTC is able to organize coefficients based on the frequency which they refer to, typically from lower to higher frequency. As a result, lower frequency coefficients are generally present in the first few macroblocks and can be easily mapped to memory offering low error rates. Control bits affect output quality more than the run-length bits, and run-length bits affect the output quality significantly more than refinement bits. Consequently, these classes of encoded bits can be stored in memory regions of increasing density and error rates, respectively. For example, the bits in the different error tolerance classes can be stored by the modified PTC algorithm into regions of a single optimized storage substrate with regions as illustrated in FIG. 4C, where this storage includes regions protected by appropriate error correction codes with different resulting error rates and storage overheads. The end result is high storage density with little image quality degradation.

Figure 5A:
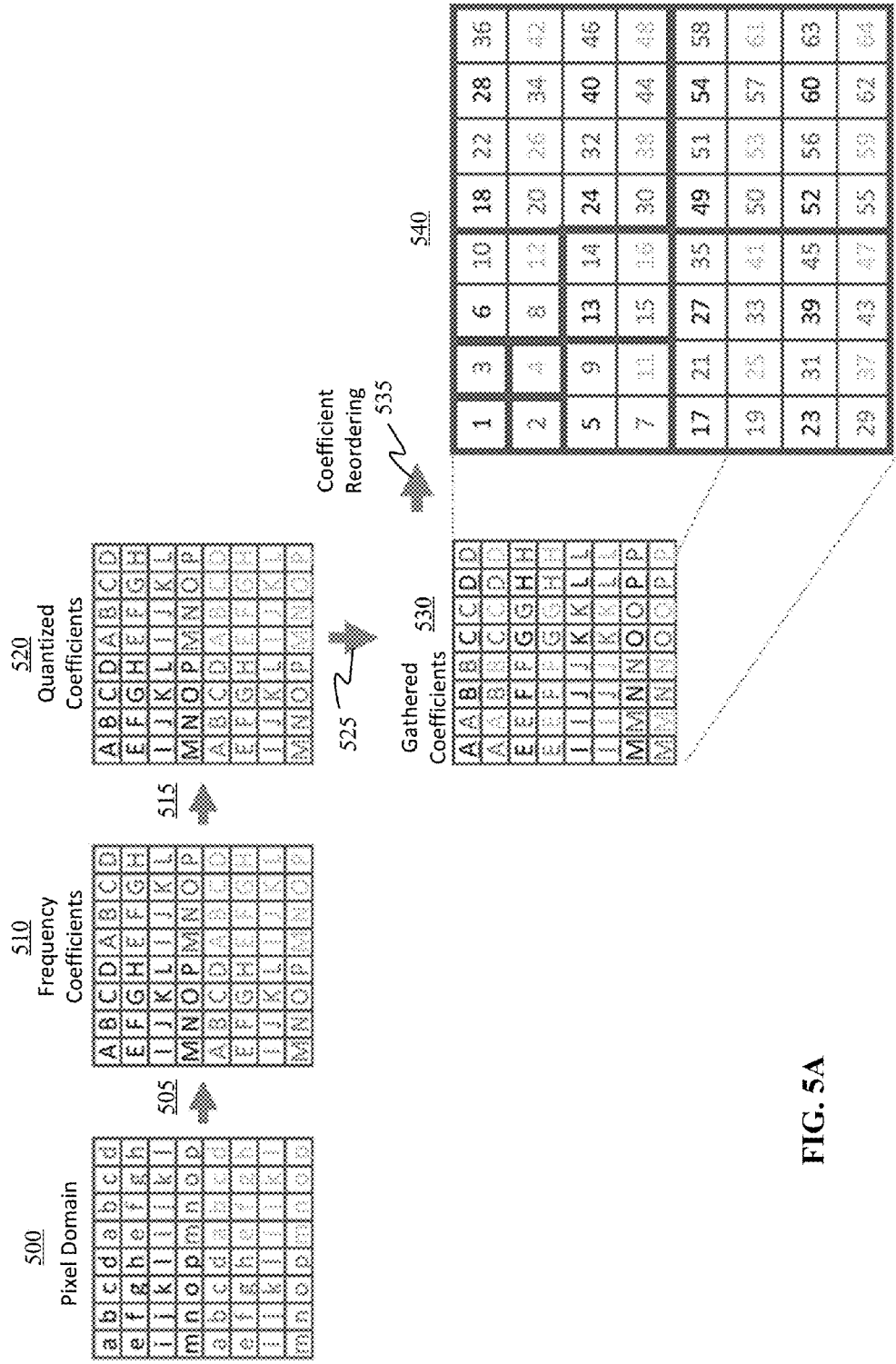
FIGS. 5A-5C illustrate encoding steps in an approximation-aware progressive transform codec (PTC) image codec.
Figures 5B, 5C:
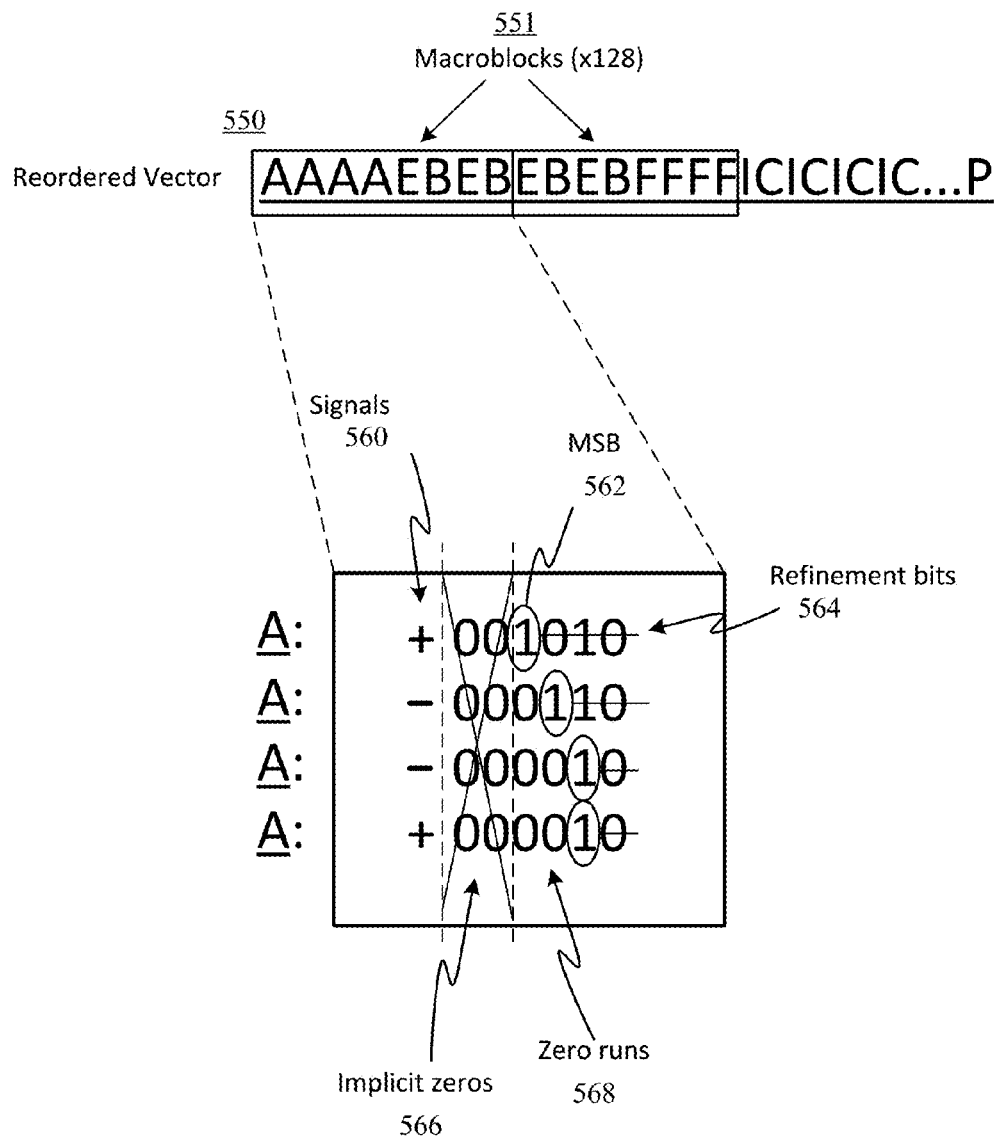

FIGS. 5A-5C illustrate encoding steps in an approximation-aware PTC image codec. As illustrated in FIG. 5A, PTC first partitions the image pixels into rectangular blocks in the pixel domain 500, each of which is transformed (505) into the frequency domain 510 using the HLBT. Next, the HBLT frequency-domain 510 coefficients are quantized (515) to provide quantized coefficients 520 (i.e., coefficients that are scaled and rounded to the nearest integer values). The quantization resolution and thus the number of bits used to represent coefficients is determined by a target quality, typically measured by peak signal to noise ratio (PSNR). Then, the quantized coefficients 520 with similar frequency are spatially gathered and grouped via a 'gather' step (525) to provide gathered coefficients 530.

Next, another reordering step (535) visits the coefficient array in a hierarchical ping-pong manner. Chart 540 illustrates the order in which coefficients 530 are visited, resulting in a vector 550 (as shown in FIG. 5B) with low-frequency coefficients clustered in the beginning and high-frequency coefficients clustered towards the end. Since the low-frequency coefficients tend to have greater absolute values and to be more important to image quality the frequency domain computations can be used to identify the different bits. As illustrated in FIG. 5B, vector 550 is divided into fixed-size macroblocks 551, each of which is subsequently encoded using the adaptive run-length/Golomb-Rice algorithm. It is at the entropy encoding step (the Golomb-Rice algorithm of the PTC) where identification of bit importance is carried out (and PTC can become approximation-aware).

The run-length encoding algorithm uses three types of bits: control bits, run-length bits, and refinement bits. As shown in FIG. 5B, values towards the top tend to be larger than values towards the bottom. The most important pieces of information for each coefficient are the signal 560 (if non-zero) and the position of its most significant bit 562 (circled). The remaining less significant bits, indicated with a strike-through pattern, are not as important: they are used to refine the corresponding coefficient value, and thus the name "refinement bits" 564. They also have near-maximum entropy, so run-length encoding cannot effectively compress them. Thus, refinement bits 564 are just added to a separate bit stream that is appended to the end of the encoded macroblock 551. Additionally, the leading zeros of a group of coefficients are not encoded, as they are implicitly defined by the encoding of the most significant bit (MSB) 562. The leading zeros are indicated in FIG. 5B as the "implicit zeroes" 566. The remaining bits are zeroes (the "zero runs" 568) and most significant (one) bits 562, which are compressed by encoding vertical runs of contiguous zeroes, as zeroes are more common than ones.

Referring to FIG. 5C, the final encoding can include the control and run-length bits 570 of the macroblock 551 and the appended refinement bits 564. The MSBs (indicated by "m" in FIG. 5C) are included in the encoded macroblock followed by a second bit to indicate the signal of a coefficient (+ or -) when its most significant bit interrupts a run.

As also illustrated in FIG. 5C, the algorithm uses a control bit to differentiate full runs from partial runs, and individual ones from individual zeroes in no run mode. In particular, the zero runs 568 can make up full runs ("f" in FIG. 5C) if the number of consecutive zeroes reaches a maximum run size, or partial runs ("p" in FIG. 5C) if the algorithm encounters a most significant bit before completing a full run. For partial runs, the run-lengths themselves are encoded right after their respective control bits and use exactly $\log_2$(maximum run size) bits. Ones and zeroes may be occasionally stored individually when the maximum run size is one (no run mode). The example approximation-aware PTC algorithm can use a header, stored in the least error prone memory (i.e., 'precise' memory), to record the mapping between macroblocks' bitstreams and the regions of memory that store them. Note that an error in control and run-length bits 570 may affect the meaning of all subsequent bits within the macroblock 551 during decoding. Thus at that point a single bit error may affect multiple coefficients within the macroblock 551.

Example Case Study—Progressive Transform Codec

The PTC image encoding algorithm was modified as described with respect to FIGS. 5A-5C to become aware of different levels of reliability of the storage cells (i.e., to become an approximation-aware encoding algorithm). PTC is similar in structure to other image encoding algorithms, so this methodology is applicable to other image encoding algorithms such as JPEG XR and JPEG 2000. As part of the cooperative design, the memory cell design is optimized. In the example case study, in addition to modifying the PTC to become approximation-aware, the PCM storage substrate was optimized to minimize errors via biasing and tuned via selective error correction to different error rate levels.

That is, the mapping of cell resistance levels to their digital values can be adjusted to perform biasing to optimize the PCM cells to balance write errors with drift errors and then the optimized cells can be tuned with selective error correction to match the bits encoded by the PTC that these cells are expected to store.

Advantageously, the combined approximation aware encoding algorithm of PTC and optimized PCM achieve significant gains in lossy compression performance. Compared to plain PTC-encoded images stored in precise PCM cells, the example system can increase the storage substrate density by over 2.7× with little decoded image degradation.

Storage Substrate Optimization

A PCM storage substrate can be optimized to offer high density, yet reasonable error rates via biasing and very low frequency scrubbing. The described optimization achieves low error rates in a 4-level configuration (2 bits/cell) and reasonably low error rates in an 8-level configuration (3 bits/cell).

Phase-change memory cells store information in the resistance of a chalcogenide material, which provides a wide enough range of resistances to allow multi-level cells. The resistance varies based on the amount of amorphous and crystalline material in the cell, which can be controlled by applying current pulses of different amplitude to the material. For SLCs, a single bit of information is stored in either a fully amorphous state (high resistance) or a mostly crystalline state (low resistance). For MLCs, each range of analog values (a level) maps to a certain binary value. On write operations, the write circuitry iteratively applies pulses and verifies if the target level was reached.

Typically, the partitioning of each resistance range is uniform and each level sits within a target level boundary of 2T, where more than a B distance (B>T) from a peak of a level's distribution may result in a value indicative of a next level of the cell. A Gray code can be used to minimize the Hamming distance between adjacent levels.

An example of uniform partitioning for PCM is a lowest resistance band $L_0$: $10^3$-$10^4 \Omega$, a second lowest resistance band $L_1$: $10^4$-$10^5 \Omega$, a second highest resistance band $L_2$: $10^5$-$10^6 \Omega$, and a highest resistance band $L_3$: $10^6$-$10^7 \Omega$). The write process typically targets the middle of these uniformly partitioned bands (e.g., $10^{3.5} \Omega$, $10^{4.5} \Omega$, $10^{5.5} \Omega$, $10^{6.5} \Omega$, respectively).

In PCM, material relaxation causes cell resistances to drift to higher resistance levels, resulting in drift errors. Resistance drift is caused by structural relaxation of the material, which increases resistance over time. The higher the resistance, the stronger the drift. Drift unidirectionally increases the cell resistance and its effect is more significant in higher resistance levels than the lower ones.

The implication is that even if a cell is correctly written originally (within 2T of a resistance range), it may drift over time to a different value, resulting in soft errors (e.g., if an $L_0$ value drifts beyond $L_0$+B).

Since the size and position of the band in the cells' resistance range determines the number of errors arising from the write process and from drift, it is possible to minimize certain kinds of errors by changing the cell's resistance ranges along with how bits are mapped to cells.

Figures 6, 7A, 7B:
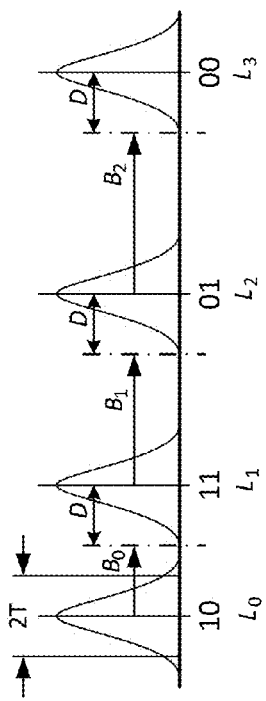
FIG. 6 illustrates an analog (resistance) range (x axis in log scale) for a four level cell using biasing to minimize drift errors.
FIG. 7A shows Table 1 of uniform (u) and biased (b) 4-level cell parameters.
FIG. 7B shows Table 2 of uniform (u) and biased (b) 8-level cell parameters.

FIG. 6 illustrates an analog (resistive) range (x-axis in log scale) for a four level cell using biasing to minimize drift errors. Instead of the uniform distribution of levels, i.e., where all levels are of the same size (in log space), biased levels, in which the analog value ranges are tuned for minimizing the combined (write and drift) error rate can be implemented.

For example, in the mapping described above, making the second highest resistance band wider (e.g., $10^5$-$10^{6.5} \Omega$) while still targeting $10^{5.5} \Omega$ during write operations will result in fewer drift errors in PCM since L2 is a level in a 4-level cell that may suffer the most drift errors.

Biasing repositions and resizes each resistance level. The combined drift error rate can be minimized by equalizing the drift error rate of each individual level (assuming the stored data maps to each level uniformly). As shown in FIG. 3C, levels are wider in value ranges where drift is more likely to have an effect, i.e., the higher resistance levels. Level biasing can be optimized based on a fixed elapsed time since the last write ("scrubbing intervals"). This assumes that the system will scrub the storage contents and reset resistance levels to the target resistance at this scrubbing interval. It is worth noting that cells will work at different scrubbing intervals, but they will suffer higher error rates compared to the interval they were optimized for because levels' error rates will not be completely equalized.

The biasing changes the target resistances from being at the center of each level (with equal bands $B_B$) to forming a narrow band at the left (D) and a wider band at the right ($B_i$) to leave more room for drift. However, as the target resistance is moved to lower values and D is reduced, the write error rate begins to increase because the tail of the write resistance distribution gets closer to the lower end of that level. The sizing of D and $B_i$s is therefore a trade-off between write error rate and drift error rate. This relationship and solution can be different for drift in other technologies. For example, some technologies may suffer drift to the lower values in the ranges. Other technologies may suffer drift to the middle values or a particular range of values in the overall range of values. For either of those types of technologies, the biasing can be conducted to form wider bands in the direction where drift may occur.

For optimization, a PCM cell's resistance range is partitioned into biased levels. Once the resistance range is partitioned into biased levels, the next step is to map digital values to individual biased levels. Both in general and in the PTC encoded images, zeroes are the most common ('00' for 4-level cells and '000' for 8-level cells), so the value zero is mapped to the highest level, which is immune to drift. There was no other value that appeared to be more common than others for images, so the values for the remaining levels were assigned by using a simple Gray code.

In a preferred implementation for the case study embodiment, three cell configurations are used: a precise configuration, a 4-level configuration and an 8-level configuration. Neither the 4-level nor the 8-level configuration achieves the published uncorrectable bit error rate of solid-state storage products ($10^{-16}$) in their raw form, but can achieve reasonably low error rates that can be error-corrected to the commercial reliability level. Even for 8-level cells, which have higher error rates, the storage overhead of error correction is lower than 100%, so even with this overhead, biased 8-level cells provide denser storage when compared to the uncorrected biased 4-level cells.

Unfortunately, even after biasing, using the modeled circuitry for 16-level cells resulted in error rates that were too high (write error rates are reasonable around $10^{-4}$, but the drift error rate is unbearably high—$10^{-1}$ after 1 second of write operation) and cannot be brought down to reasonable rates by error correction with storage overhead low enough to justify the increase in number of levels. The 2-level and 3-level cells were used as precise baselines since they show very low error rates. On the one hand, 2-level cells are simpler and faster. On the other hand, 3-level cells offer higher density at still low enough error rates to be considered precise. The 4-level and 8-level cells were then used as approximate memory cells.

Even after biasing, drift may still be an issue in the long-term. To mitigate excessive drift, scrubbing can be used to rewrite the cell and bring the resistance level back down. Based on the PCM cell model (described in more detail below), the scrubbing period was expected to be on the order of 3 months ($10^7$ seconds). The average access bandwidth on the order of 100 bits/second per gigabit of storage is a negligible figure. Also, if data is going to be scrubbed anyways, this may be a good opportunity to also perform wear leveling.

Once cells are optimized, the cells can be tuned to provide different error rate levels. The storage controller is responsible for offering a variety of error correction codes, each at a different point in the space defined by the storage overhead required for metadata storage and the error rate reduction provided. In principle this results in higher controller complexity, but in practice using multiple codes in the same family (e.g., BCH-4 and BCH-16) may keep complexity under control.

The controller is also responsible for organizing the storage into regions, each with a different error correction strength. The controller stores a region-to-configuration map in a table resident in the controller and backed by a preconfigured precise region of storage that persists the map during power cycles. System software sends special configuration commands to the controller to allocate and configure regions. Once configured, the controller uses the requested address and the information in the region-to-configuration map to determine which region the request targets and the appropriate error correction strength to use in servicing the request. The number of different regions is small (e.g., 8 in this example), so the region-to-configuration map can support variable-size regions and be fully associative.

The code implementing the modified algorithm allocates storage in different configurations. Assuming a storage system directly accessible through the processor address space, each bitstream can simply be allocated via a persistent object interface, and pointed to by the header. If a file system is used, then all storage in a block needs to be in the same configuration. The file system provides calls to specify the memory configuration when opening streams and to concatenate multiple streams to form a single file. If no changes to the file system are possible or desirable, the multi-precision memory (e.g., the dynamic approximate storage substrate) may be exposed as an independent volume providing an "image store" that maintains and serves the collection of images using approximate storage, where each image can be linked from the main file system. The operating system or the storage controller can be responsible for any necessary maintenance tasks, such as wear leveling, refreshing the memory to limit degradation over time, and reconfiguring the storage after power failure.

Regions with different error correction have different metadata overhead. As such, different regions will need different number of cells to store the same number of data bits. The entire storage space may be managed in one of two ways. Static management simply partitions the storage into multiple regions at manufacturing time. This approach is inflexible in that it does not allow a different proportion of storage to be dedicated to a region. The second approach is to allow dynamic reconfiguration of regions to match application demands. In this case, region resizing causes additional complexity. Assuming the storage device leaves manufacturing with all regions initialized to the strongest available error correction by default, when a region is configured of the first time, it grows in density, and thus in usable size. A simple way to cope with this is to expose this region as two regions, one of the original size before reconfiguration, and a virtual one with the surplus storage. This makes addressing simpler. A region can only be reconfigured to a smaller size if the system can accommodate the contents of the surplus region elsewhere.

Evaluation Setup

A custom simulation infrastructure was used for the multi-level cell simulations. The quality measurements were based on 24 grayscale raw images at 768×512 pixels resolution in the Kodak PCD image set. Configurations and parameter settings for 4-level cells and 8-level cells are summarized in FIGS. 7A and 7B, respectively. FIG. 7A shows Table 1 of uniform (u) and biased (b) 4-level cell parameters. $R_T$ denotes the mean resistance of a level, and $R_B$ denotes the resistance at the upper boundary of the level. FIG. 7B shows Table 2 of uniform (u) and biased (b) 8-level cell parameters. Note that, compared to uniform cells, biased cells have target levels (log $R_T$) and the level boundaries (log $R_B$) move toward lower resistances by appropriate amounts, resulting in lower drift-induced errors at the cost of increased write errors. The write error rate of biased cells was set to the order of $10^{-6}$ according to the application's characteristics. The overall drift error rate can be minimized by equalizing the drift error rates for all the levels (except for the first level and the last level). Cells are optimized for a scrubbing interval $t=10^7$s (about 3 months) after they are written. During scrubbing, their original target resistance is restored.

The proposed system was evaluated by two metrics: peak signal to noise ratio (PSNR) and memory density. PSNR compares the original image, pixel by pixel, with the decoded image that contains errors from lossy compression algorithm (e.g., quantization) and memory subsystem (in this case, uncorrected write errors and drift errors). The higher the PSNR value, the smaller the difference between the original and the reconstructed images.

The approximate memory system was evaluated with images from several target PSNR levels, i.e., 35 dB, 38 dB, 40 dB, and 42 dB. For most images, 40-42 dB range denotes high image quality, with distortion nearly imperceptible visually; whereas, 38 dB and 35 dB represent mediocre and low quality, respectively. Due to the nondeterministic error patterns in the approximate memory system, 100 samples of each image were run in the benchmark and the minimum PSNR was used, which gives a lower bound on the quality of the reconstructed image. Memory density is defined as the number of data bits stored by a cell. Error-prone memories (e.g., PCM) commonly use error correction codes (ECC) to recover from certain number of errors. The storage overhead of error correction bits may degrade memory density.

Simulation Results

The benefits of tailoring the PTC image encoding algorithm to a PCM approximate storage substrate can be seen from the following results.

Figure 8:
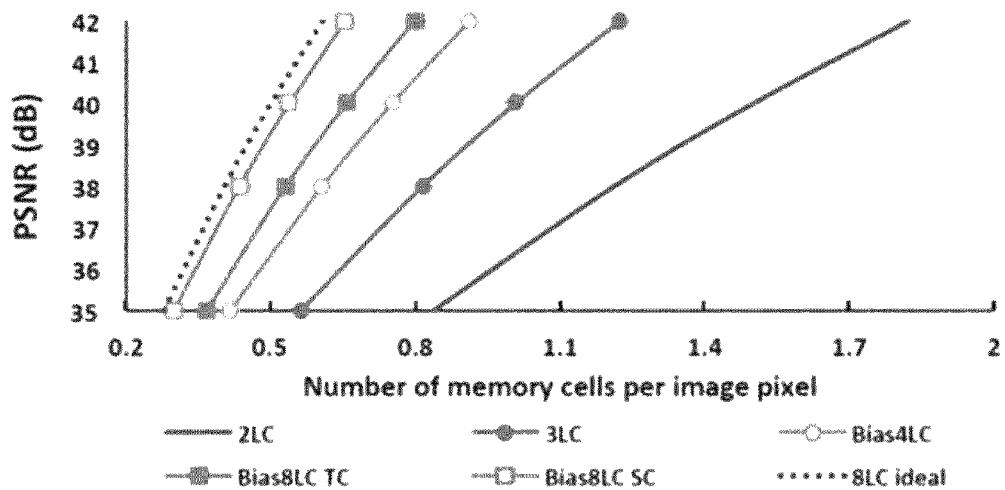
FIG. 8 shows a plot of peak signal to noise ratio (PSNR) to the number of memory cells per image pixel comparing 2-level cells, 4-level cells, and 8-level cells with and without biasing.

FIG. 8 shows a plot of peak signal to noise ratio (PSNR) to the number of memory cells per image pixel comparing 2-level cells, 4-level cells, and 8-level cells with and without biasing. This plot shows a comparison of a fully optimized design and intermediate alternatives against PTC on the SLC PCM, in quality versus memory area. The memory area (x-axis) is measured by the number of memory cells being used, normalized to the image size in pixels. The y-axis shows the reconstructed image quality after having been encoded and stored in the approximate memory for a scrubbing interval ($10^7$s). As high-density memory cells often suffer higher error rate, image quality and memory area are at odds. As such, the further left a curve is, the better the quality versus memory area trade-off it represents.

From right to left, the worst performance comes from the PTC algorithm on SLC PCM ("2LC"), where the quality and area trade-off is solely controlled by the quantization factor; previously proposed tri-level PCM ("3LC") results in a 1.58× (i.e., $\log_2 3$) increase in density without any quality loss from the encoded images. However, the circuitry to deal with base transformations adds complexity to the memory system interface. In comparison, the biased 4-level cell ("Bias4LC"), which requires no complex base transformation circuitry, results in a higher density (1.85× over 2LC), while still maintaining the same level of image quality. The only cost of biasing is the optimization of cell levels and boundaries at design time.

Finally, three biased 8-level cell configurations can be seen on the left: biased 8-level cell with thorough correction ("Bias8LC TC"), biased 8-level cell with select correction ("Bias8LC SC"), and an 8-level cell with idealized correction ("8LC ideal"). Note that all of the 8-level cell configurations use error correction because at this density the quality degrades dramatically if no error correction is used (10 dB range, which is unacceptable). In particular, the configurations shown include error correction applied thoroughly and equally to the entire storage (Bias8LC TC), selective error correction applied based on the algorithm's needs (approximation-aware) (Bias8LC SC), and an idealized correction mechanism that has no storage overhead and corrects all errors (8LC ideal).

Despite gaining 2.28× in density over 2LC, the Bias8LC TC uses more correction strength than necessary to maintain high quality. In contrast, by carefully choosing the appropriate ECC scheme for each encoded bits class, Bias8LC SC achieves a density of 2.73× over 2LC (less than 10% lower than the ideal 8-level cell density gain, i.e., 3×), while keeping quality loss at an acceptable level (<1 dB loss).

The impact of different coded bitstreams on the quality of reconstructed images was evaluated. It can be desirable to keep the quality loss within 1 dB of the encoded image. For example, a target quality of 40 dB will allow degradation only down to 39 dB. To evaluate the effect of errors on encoded bit types, the effects of control, run-length, and refinement bits were evaluated across all the macroblocks.

Figure 9:
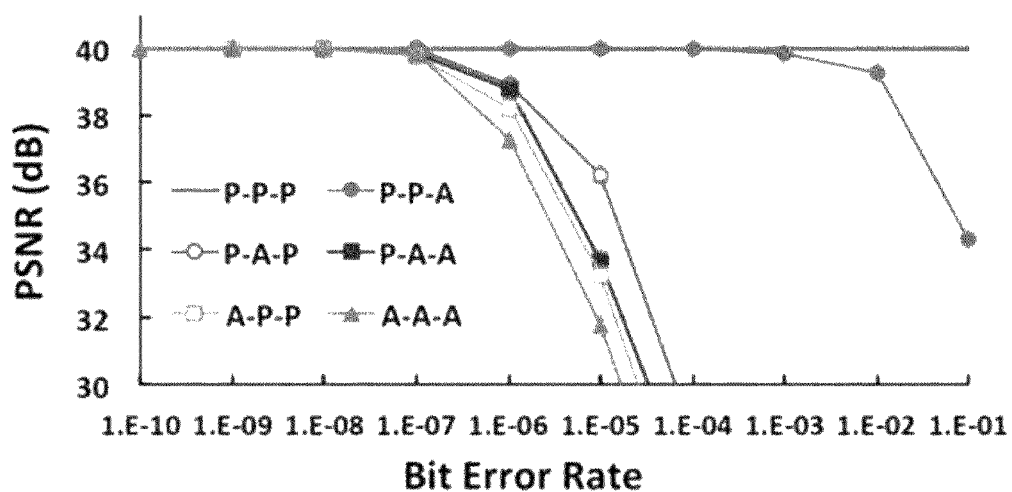
FIG. 9 shows a plot of PSNR for approximate bit streams comparing control bit—run length bit—refinement bit allocation to precise and approximate substrates with varying bit error rates.

FIG. 9 shows a plot of PSNR for approximate bit streams comparing control bit—run length bit—refinement bit allocation to precise and approximate substrates with varying bit error rates. Image quality degradation is shown when different approximate bit streams are used for the three bit streams. In the legend P denotes precise substrate and A denotes approximate substrate with bit error rates (BERs) varying along the x-axis. The first letter represents the control bits, the second letter represents run length bits, and the third letter represents refinement bits.

Intuitively, control bits are more precision-critical than run-length bits, then followed by refinement bits. FIG. 9 corroborates this by applying variable error rates over a subset of bits based on their types and measuring the resulting quality degradation. All images are encoded with a target quality of 40 dB. Each curve is labeled with three letters representing whether the error rate (in the x axis) is applied (A) or not (P) to each of control, run-length, and refinement bit types, respectively.

As shown by the plot in FIG. 9, P-P-P does not suffer any failures and maintains the quality at the target 40 dB. Refinement bits affect image quality the least, as such, P-P-A can tolerate quite high error rates (this curve starts dropping only when BER reaches $10^{-4}$). Next, P-A-P and P-A-A (with the introduction of run-length errors) can tolerate failure rates up to $10^{-7}$ with no or very little image quality degradation. Control bits are the most error-sensitive (A-P-P and A-A-A), also degrading quality quickly as failure rates go above $10^{-7}$. This analysis supports the idea of adjusting error correction selectively, maintaining a lower error rate for control and run-length bits ($10^{-7}$), and a higher error rate ($10^{-3}$) for refinement bits. Due to the large gap between the error rate requirements for refinement bits and other types of bits, refinement error rates were fixed at $10^{-3}$, committing 0.2 dB of the 1 dB quality degradation budget.

Figure 10:
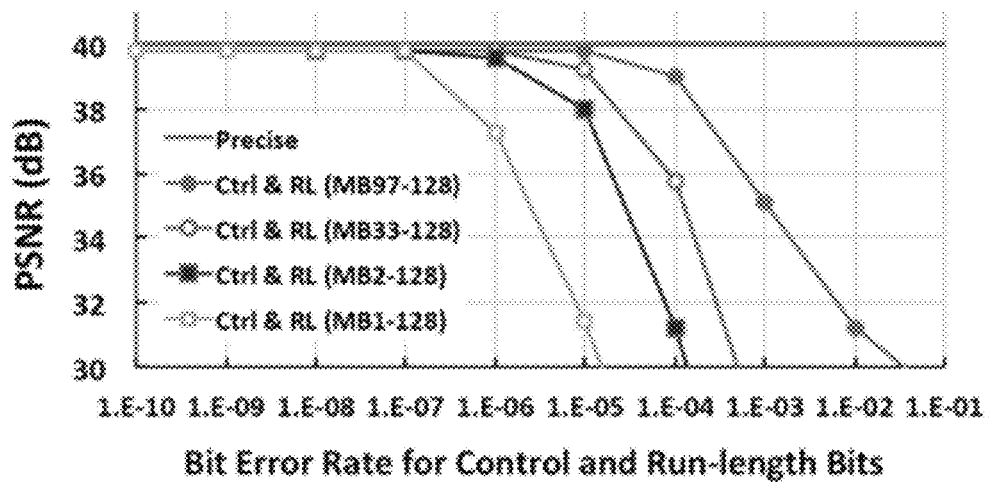
FIG. 10 shows a plot of PSNR with increasing error rates for control (Ctrl) and run-length (RL) bits in specified macroblocks (MBs).

Next, the effect of different macroblocks on quality was studied. FIG. 10 shows a plot of PSNR with increasing error rates for control (Ctrl) and run-length (RL) bits in specified macroblocks (MBs). In each simulation, the Ctrl and RL bits outside the denoted MBs use a BER of $10^{-16}$ and refinement bits use a BER of $10^{-3}$.

As mentioned above, the first macroblock, which holds the lowest frequency coefficients, plays the most important role on the decoded image quality. FIG. 10 verifies this statement by applying strong correction (at an error rate of $10^{-16}$) to the first n macroblocks in a coded image of a total of 128 macroblocks, variable error rates for control and run-length bits in the remaining blocks, and the fixed error correction (at an error rate of $10^{-3}$) for refinement bits in all blocks.

As predicted, Ctrl & RL (MB2-128), which protects control and run-length bits in the first macroblock, improves quality substantially compared to the Ctrl & RL (MB1-128), which leaves the first macroblock at the same error rate as other macroblocks. On the other hand, protecting additional macroblocks has diminishing returns. These results suggest that protecting the first macroblock's control and run-length bits with a strong error correction for commercial error rates ($10^{-16}$), and then protecting the remaining control and run-length bits with an intermediary strength code ($10^{-6}$) keeps quality well within the 1 dB degradation limit.

Figure 11:
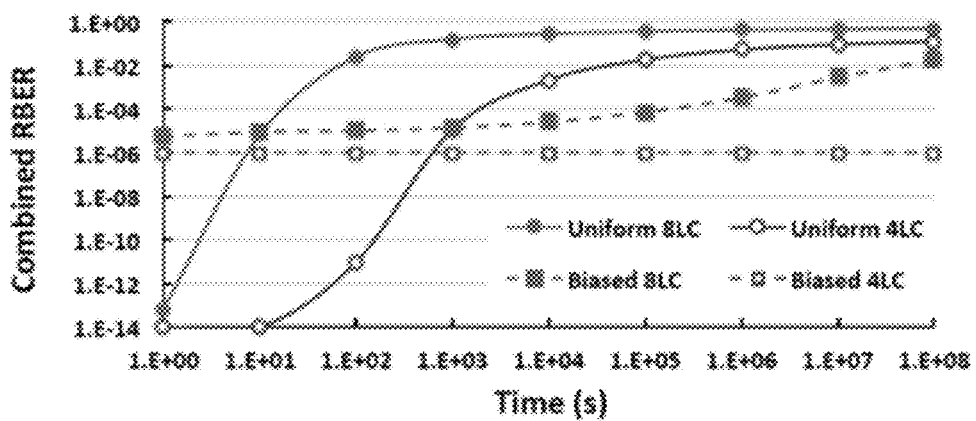
FIG. 11 shows a plot of combined raw bit error rates (RBERs) over time of uniform and biased PCM cells.

With target error rates for error tolerance classes in hand, the focus turns to bringing the PCM substrate up to these standards. First, the substrate is optimized for an arbitrary scrub rate ($10^7$s, or approximately 3 months) by optimizing cells via biasing. FIG. 11 shows a plot of combined raw bit error rates (RBERs) over time of uniform and biased PCM cells. Here, the effect of biasing on error rates, for both 4-level and 8-level cells, is illustrated, reporting combined error rates across all levels. Error rates grow over time because of drift effects.

Initially, 4-level and 8-level uniform cells (Uniform 4LC and Uniform 8LC) are used. As expected, error rates for 4-level cells are always lower than for 8-level cells because fewer levels allow more room for drift in each level. However, both types of cells start showing excessively high error rates even only an hour after being written. In contrast, Biased 4LC maintains very low drift error rates during the range of time ($10^{-20}$ at $10^{10}$ s). The raw bit error rate (RBER) of the Biased 4LC is dominated by the write errors. Biased 8LC, which combines highest density with reasonably low error rates, provides a good trade-off with error rate of about $10^{-3}$, two orders of magnitude lower than Uniform 8LC at $10^7$s. Luckily, it also matches the needs of the most error tolerant bits (i.e., the refinement bits). This allows no error correction to be used at all for these bits, eliminating unnecessary metadata overhead.

Figure 12:
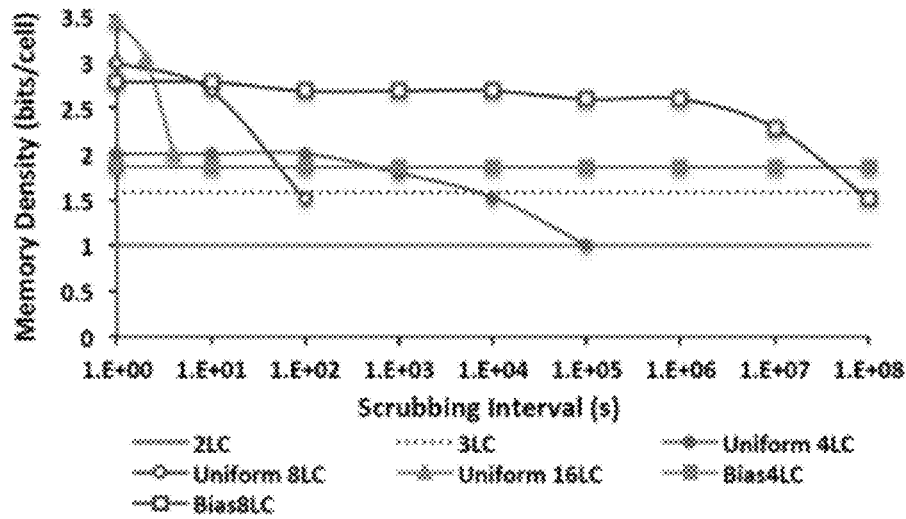
FIG. 12 shows a plot of density with increasing scrubbing intervals comparing uniform and biased PCM cells.

FIG. 12 shows a plot of density with increasing scrubbing intervals comparing uniform and biased PCM cells. FIG. 12 provides insight on which cell configuration offers the best trade-off between overall density for the example implementation, including error correction to maintain uncorrectable bit error rate (UBER) at commercial rates ($10^{-16}$), and scrubbing overhead. 2LC and 3LC cells have RBERs as low as precise memory, and hence do not require error correction. 3LC provides 1.58× higher density over 2LC. The densities of uniform cells (i.e., 4LC, 8LC, and 16LC), although high for short scrubbing intervals (so short they are unattractive), fall sharply at longer intervals, since drift-induced errors accrue fast. In contrast, biasing suppresses the growth of drift error rates significantly: Bias4LC has stable 1.86× density gains (due to write errors), and Bias8LC experiences a much smoother density degradation, achieving 2.28× density improvement after about 3 months ($10^7$s).

Figure 13:
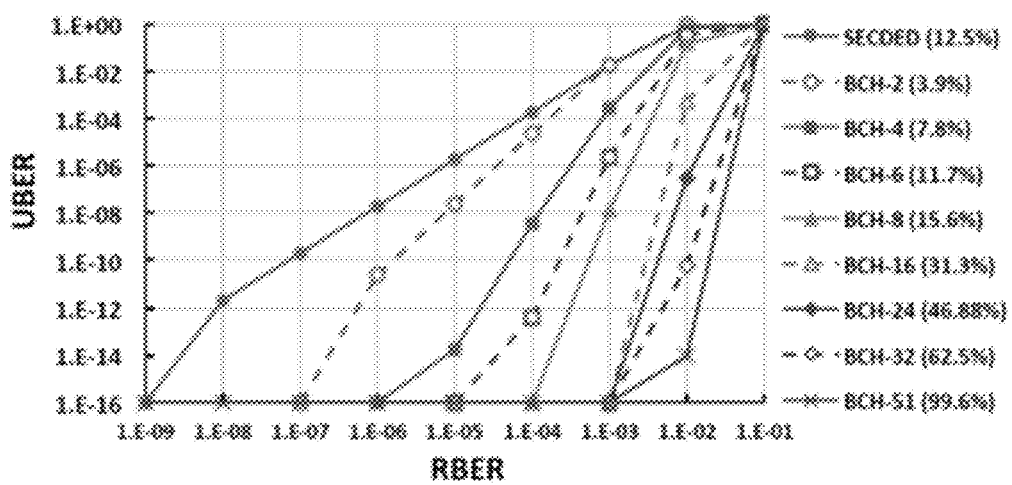
FIG. 13 shows a plot comparing capabilities and overheads of error correction codes (ECC) at 512 data bit blocks.

Once both the algorithmic error rate requirements are determined and the substrate is optimized for lowest possible error rates, the algorithm and substrate can be matched via error correction. This relies on understanding the trade-offs between storage overhead of the error correction mechanism and its correcting power. FIG. 13 shows a plot comparing capabilities and overheads of error correction codes (ECC) at 512 data bit blocks. In FIG. 13, a variety of error correction mechanisms (with storage overheads), and the correspondence between raw bit error rates (RBER) and uncorrectable bit error rates (UBER) are provided.

Single error correcting and double-error detecting (SECDED) ECC corrects one error and detects up to two errors in 72 bits; each of the BCH codes corrects up to the denoted number of errors in 512 data bits plus overhead. The biased 8LC cell already meets the demands of refinement bits, so they don't need any correction. For control and run-length bits in the first macroblock, a correction mechanism is desired that accepts a RBER of $10^{-3}$ and produces a UBER of $10^{-16}$. BCH-16 is the code that provides this capability with the lowest storage overhead (31.25%). Luckily, the bits that need such a strong error correction are only a small fraction (2.13%) of all bits. Finally, BCH-6 provides a $10^{-6}$ UBER at an overhead of 11.7% for the remaining 81.67% of the bits.

It is also worth noting that as RBER increases, the code strength required to maintain the same UBER grows rapidly. This highlights the value of biasing: had it not lowered the error rate by two orders of magnitude, the 8-level cell design would have offered RBER so high that the overhead of correcting all errors would have made it prohibitive.

The scrubbing period chosen for the biasing optimization was somewhat arbitrary. To illustrate the effects of using the same described cell design with other scrubbing intervals (so the cells are used "out-of-spec" for different scrubbing intervals), simulations were performed over the different scrubbing intervals. If the interval is shorter than specified, write errors dominate; if the interval is longer, drift errors dominate instead.

Figure 14:
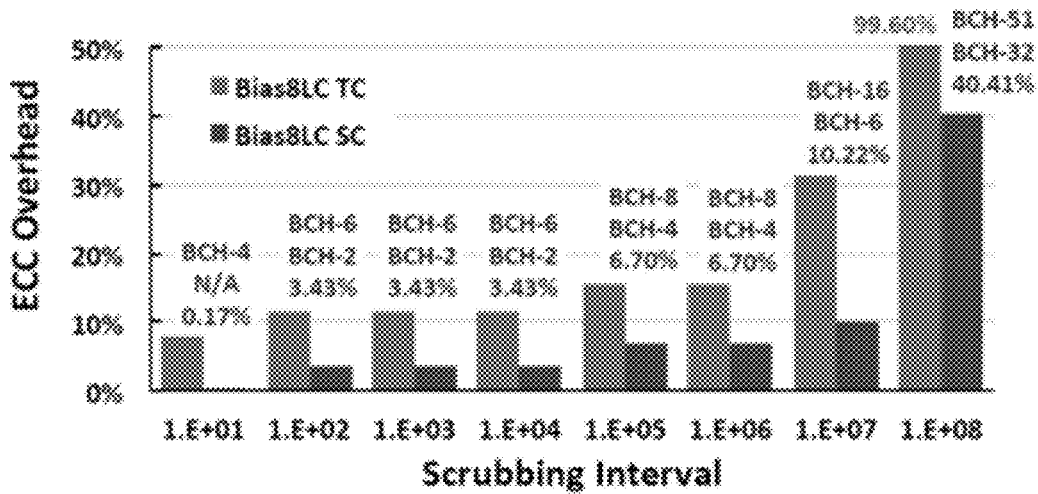
FIG. 14 shows a graph illustrating the trade-off between ECC storage overhead and scrubbing interval.

FIG. 14 shows a graph illustrating the trade-off between ECC storage overhead and scrubbing interval. For each column, the code in the first row is applied to all the bits in thorough correction (TC); the selective correction (SC) uses the first-row ECC for the control and run-length bits in MB1, and the second-row ECC for the control and run-length bits in other MBs, and leaves all refinement bits unprotected. The third row shows the total overhead for SC. In FIG. 14, it can be seen how error correction selection would have changed for different scrubbing intervals (assuming <1 dB quality degradation).

The graph in FIG. 14 compares thorough correction (Bias8LC TC) with selective correction (Bias8LC SC) side-by-side at each interval. As the scrubbing interval increases (towards the right of x-axis), stronger ECC mechanisms must be employed to suppress the growth of drift error rate, resulting in higher storage overheads. On the other hand, larger intervals reduce system energy and bandwidth overheads due to data movement and checker bits computation generated by the scrubbing.

Although $10^7$ seconds was selected as the target scrubbing interval for the dense, approximate image storage system, shorter intervals might also be acceptable for other systems if higher density is the top priority. The main takeaway from these results, however, is that selectively applying error correction only where needed can significantly reduce the loss in density while bringing the memory to the algorithmically-required error rates, as evidenced by the large difference in each pair of bars. By including the biasing (optimized at the scrubbing interval of $10^7$s), only 10.22% storage overhead (brought down from almost 32%) is required, resulting in being able to reach storage density 2.73× over the 2-level baseline.

Figure 15:
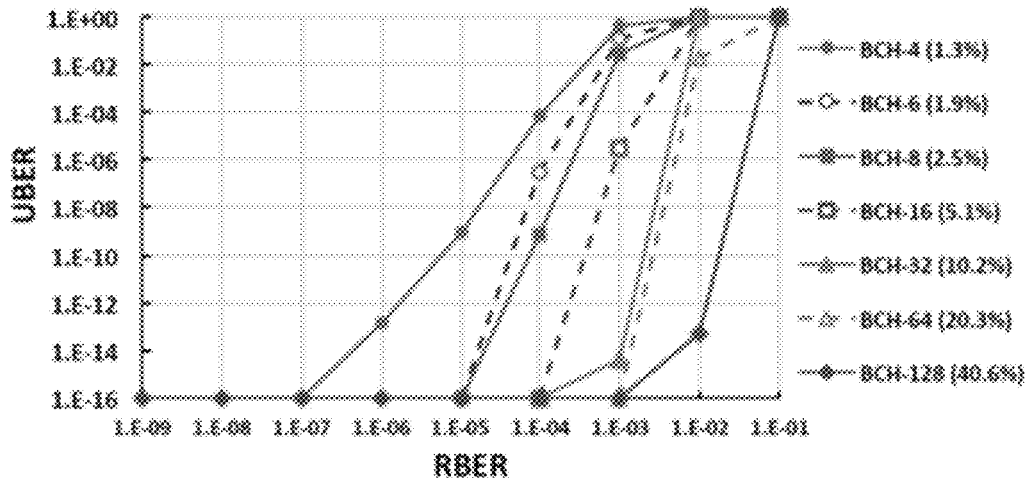
FIG. 15 shows a plot comparing capabilities and overheads of ECC at 512 data byte block for Flash.

Although the proposed co-design of image encoding algorithm and approximate memory bases the study on multi-level PCM, the framework is readily applicable to other technologies, e.g., Flash, particularly multi-level Flash (e.g., TLC NAND Flash). In such devices, ECCs (BCH and LDPC are common) are applied to a sector of 512 bytes (or greater, such as 1024 bytes). FIG. 15 shows a plot comparing capabilities and storage overheads of ECC at 512 byte block data (typical of Flash). Each code is able to correct the denoted number of errors in a 512 Byte Flash sector and the augmented ECC checker bits.

Prior studies report that TLC NAND Flash devices have an initial RBER of $10^{-4}$, which increases gradually with the number of program/erase cycles. Accordingly, a TLC Flash could use BCH-16 for the cells that store the control and run-length bits in MB1, and BCH-6 for the remaining control and run-length bits, and leave all refinement bits uncorrected. This together results in 2.96× higher density than SLC while maintaining a <1 dB quality loss. In comparison, thorough correction (uses BCH-16 uniformly) achieves 2.85× higher density. However, these numbers only apply to a brand new device. RBER increases along with program/erase cycles, so stronger ECCs are gradually required. For instance, RBER reaches $10^{-3}$ after approximately 3000 program/erase cycles. At this point, the density improvement of selective correction and thorough correction lower to 2.88× and 2.49×, respectively, making selective correction more attractive.

Accordingly, co-designed image encoding and storage mechanisms provide denser approximate storage. By identifying the relative importance of encoded bits on output image quality and performing error correction according to the identified relative importance, it is possible to increase storage capacity. Level biasing can further be incorporated into storage to reduce error rates in substrates subject to drift. The result in the example case study is a storage density increase of over 2.7× with little quality degradation (less than 1 dB). Although PTC image encoding and PCM were specifically discussed herein, the described systems and techniques are applicable to other storage substrates and to other algorithms that encode signals in the frequency domain followed by entropy coding, like audio and video codecs.

To modify the example image encoding algorithm, a methodology was developed to determine relative importance of encoded bits created by specific encoding algorithms. These bits can then be separately stored in regions of approximate storage substrate specifically optimized for the relative importance of the encoded bits. Each of these regions is matched to the error tolerance of bits they store by applying a specific error correction code (selective error correction), although other approaches are possible. The higher the bits' error tolerance, the higher the space savings. Algorithm modifications can be implemented by a programmer expert in image encoding who is given the various error correction options provided by the storage hardware, along with their corresponding error rates. The final algorithm is packaged in a library.

This cooperative design effort may be undertaken by memory manufacturers, who ship their hardware along with supporting libraries, or by system integrators designing a product that includes digital imaging, where the library is never exposed. Final users of these products can set the expected quality of the image in a similar manner to how users already interface with lossy encoding algorithms such as JPEG today. This is possible because, from a user's perspective, errors caused by approximate storage are simply one more source of image quality loss.

Certain embodiments of the described approximation-aware encoding algorithms may be implemented as a computer process, a computing system, or as an article of manufacture, such as a computer program product or computer-readable medium. Certain methods and processes described herein can be embodied as code and/or data, which may be stored on one or more computer-readable media. Certain embodiments of the invention contemplate the use of a machine in the form of a computer system within which a set of instructions, when executed, can cause the system to perform any one or more of the methodologies discussed above. Certain computer program products may be one or more computer-readable storage media readable by a computer system and encoding a computer program of instructions for executing a computer process. Computer-readable media can be any available computer-readable storage media or communication media that can be accessed by the computer system.

Communication media include the media by which a communication signal containing, for example, computer-readable instructions, data structures, program modules, or other data, is transmitted from one system to another system. The communication media can include guided transmission media, such as cables and wires (e.g., fiber optic, coaxial, and the like), and wireless (unguided transmission) media, such as acoustic, electromagnetic, RF, microwave and infrared, that can propagate energy waves. Carrier waves and other propagating signals that may contain data usable by a computer system are not themselves "computer-readable storage media." Indeed, computer-readable storage media explicitly does not consist of carrier waves or propagating signals.

Certain aspects of the invention provide the following non-limiting embodiments:

EXAMPLE 1

A method of encoding data on single level or variable multi-level cell storage, comprising: receiving a block of encoded data from an application and at least an importance attribute associated with the block of encoded data, the importance attribute indicating a relative sensitivity of bits of the block to errors in an output quality from decoding the encoded data; and assigning the block of encoded data to a memory address or a particular region of a memory based at least according to the importance attribute, wherein the memory has at least two precision levels.

EXAMPLE 2

The method of example 1, wherein assigning the block of encoded data to the memory address or a particular region of the memory based at least according to the importance attribute comprises: in response to the importance attribute indicating a relative low sensitivity to errors, assigning the block to a low precision level region of the memory; in response to the importance attribute indicating a relative moderate sensitivity to errors, assigning the block to a moderate precision level region of the memory; and in response to the importance attribute indicating a relative high sensitivity to errors, assigning the block to a high precision level region of the memory.

EXAMPLE 3

The method of example 1 or 2, wherein the at least two precision levels comprise a low precision level, a moderate precision level, and a high precision level, wherein the low precision level stores more bits per cell than the moderate precision level and the high precision level, and the high precision level has more error correction overhead than the moderate precision level.

EXAMPLE 4

The method of any of examples 1-3, further comprising: receiving an indication of application type of the application; and assigning threshold levels to perform a biasing of value ranges in a cell for at least one of the at least two precision levels according to the application type.

EXAMPLE 5

The method of any of examples 1-4, further comprising: assigning binary values to ranges in a cell for at least one of the at least two precision levels based on frequency of occurrence of bit patterns for the application, wherein assigning the block of encoded data is further based according to the bit pattern for the encoded data from the application.

EXAMPLE 6

The method of any of examples 1-5, wherein the memory comprises a single level cell memory having at least two types of available error correction overhead.

EXAMPLE 7

The method of any of examples 1-6, wherein the memory comprises a multi-level cell memory having at least two regions of varying density.

EXAMPLE 8

The method of any of examples 1-7, wherein the memory comprises a multi-level cell memory having at least two types of available error correction overhead.

EXAMPLE 9

The method of any of examples 1-8, wherein the application comprises an approximation-aware image encoding algorithm.

EXAMPLE 10

One or more computer readable storage media having instructions for an approximation-aware image encoding algorithm stored thereon, that when executed by a processor, direct the processor to: identify at least two levels of output quality importance for output data bits of the approximation-aware encoding algorithm; and partition the output data bits according to their identified output quality importance level.

EXAMPLE 11

The media of example 10, wherein the instructions that direct the processor to identify at least two levels of output quality importance, direct the processor to: convert pixels of an image from space domain to frequency domain; and assign coefficients that encode low frequency components to an importance attribute indicating high sensitivity to errors and assign coefficients that encode high frequency components to an importance attribute indicating lower sensitivity to errors.

EXAMPLE 12

The media of example 11, wherein the instructions that direct the processor to assign coefficients that encode low frequency components to an importance attribute indicating high sensitivity to errors and assign coefficients that encode high frequency components to an importance attribute indicating lower sensitivity to errors, comprise instructions that direct the processor to: gather frequency coefficients of similar frequency into a vector so that the frequency coefficients falling within a relatively low frequency coefficient range are clustered in beginning of the vector and the frequency coefficients falling within a relatively high frequency coefficient range are clustered towards the end of the vector with the frequency coefficients falling within a relatively intermediate frequency coefficient range being clustered in between; divide the vector into macroblocks; and perform entropy encoding of the macroblocks to generate encoded macroblocks comprising control bits, run-length bits, and appended refinement bits.

EXAMPLE 13

The media of example 12, wherein the control bits and the run-length bits of a header and the first macroblock are assigned to the importance attribute indicating the higher sensitivity to errors; the control bits and the run-length bits of the macroblocks other than the first macroblock are assigned to the importance attribute indicating an intermediate sensitivity to errors; and wherein the appended refinement bits are assigned to the importance attribute indicating the lower sensitivity to errors.

EXAMPLE 14

The media of example 11, further comprising instructions stored thereon that, when executed by the processor, direct the processor to: indicate frequency of particular bit patterns for the approximation-aware algorithm.

EXAMPLE 15

A system comprising: a processing system; one or more computer readable storage media, the one or more computer readable storage media comprising at least one approximate storage; an operating or file system stored on at least one of the one or more computer readable storage media that when executed by the processing system, directs the processing system to: assign a block of encoded data to a memory address or a particular region of the at least one approximate storage based at least according to an importance attribute indicating an error rate tolerance of the block of encoded data.

EXAMPLE 16

The system of example 15, wherein the operating or file system further directs the processing system to: specify a memory configuration for the approximate storage.

EXAMPLE 17

The system of example 16, wherein instructions to specify a memory configuration for the approximate storage, direct the processing system to: provide threshold levels to perform a biasing of value ranges for a cell in the particular region according to an application type of an application from which the block of encoded data is received.

EXAMPLE 18

The system of example 16 or 17, wherein instructions to specify a memory configuration for the approximate storage, direct the processing system to: provide an indication of a level of error correction for a cell in the particular region based on the importance attribute.

EXAMPLE 19

The system of any of examples 16-18, wherein instructions to specify a memory configuration for the approximate storage, direct the processing system to: provide binary values to ranges for a cell in the particular region based on frequency of occurrence of bit patterns for an application from which the block of encoded data is received.

EXAMPLE 20

The system of any of examples 15-19, wherein instructions to assign the block of encoded data to the memory address or the particular region of the at least one approximate storage direct the processing system to write a flag indicating a level of precision associated with the block of encoded data.

EXAMPLE 21

The system of any of examples 15-20, wherein the operating or file system further directs the processing system to: provide an application programming interface for an approximation-aware application to indicate the importance attribute of data to be stored.

EXAMPLE 22

A system or product for performing the method of any of examples 1-9.

EXAMPLE 23

A system comprising a means for receiving a block of encoded data from an application and at least an importance attribute associated with the block of encoded data, the importance attribute indicating a relative sensitivity of bits of the block to errors in an output quality from decoding the encoded data; and a means for assigning the block of encoded data to a memory address or a particular region of a memory based at least according to the importance attribute, wherein the memory has at least two precision levels.

It should be understood that the examples and embodiments described herein are for illustrative purposes only and that various modifications or changes in light thereof will be suggested to persons skilled in the art and are to be included within the spirit and purview of this application.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A method of encoding data on single level or variable multi-level cell storage, comprising:
   receiving a block of encoded data from an application and at least an importance attribute associated with the block of encoded data, each block of encoded data encoding frequency coefficient components of similar frequency such that all low frequency coefficient components are grouped together in separate blocks from the high frequency coefficient components, and the importance attribute indicating a relative sensitivity of bits of the block to errors in an output quality from decoding the encoded data; and
   assigning the block of encoded data to a memory address or a particular region of a memory based at least according to the importance attribute, wherein the memory has identifiable regions providing a corresponding one of at least two precision levels, the assigning being to the memory address or the particular region of the memory of an appropriate one of the at least two precision levels based at least according to the importance attribute.

2. The method of claim 1, wherein the identifiable regions providing the corresponding one of at least two precision levels comprise a low precision level region, a moderate precision level region, and a high precision level region, wherein assigning the block of encoded data to the memory address or a particular region of the memory based at least according to the importance attribute comprises:
   in response to the importance attribute indicating a relative low sensitivity to errors, assigning the block to the low precision level region of the memory;
   in response to the importance attribute indicating a relative moderate sensitivity to errors, assigning the block to the moderate precision level region of the memory; and
   in response to the importance attribute indicating a relative high sensitivity to errors, assigning the block to the high precision level region of the memory.

3. The method of claim 1, wherein the at least two precision levels comprise a low precision level, a moderate precision level, and a high precision level, wherein the low precision level stores more bits per cell than the moderate precision level and the high precision level, and the high precision level has more error correction overhead than the moderate precision level.

4. The method of claim 1, further comprising:
   receiving an indication of application type of the application; and
   assigning threshold levels to perform a biasing of value ranges in a cell for at least one of the at least two precision levels according to the application type.

5. The method of claim 1, further comprising:
   assigning binary values to ranges in a cell for at least one of the at least two precision levels based on frequency of occurrence of bit patterns for the application,
   wherein assigning the block of encoded data is further based according to the bit pattern for the encoded data from the application.

6. The method of claim 1, wherein the memory comprises a single level cell memory having at least two types of available error correction overhead.

7. The method of claim 1, wherein the memory comprises a multi-level cell memory having at least two regions of varying density.

8. The method of claim 1, wherein the memory comprises a multi-level cell memory having at least two types of available error correction overhead.

9. The method of claim 1, wherein the application comprises an approximation-aware image encoding algorithm.

10. One or more computer readable storage media having instructions for an approximation-aware image encoding algorithm stored thereon, that when executed by a processor, direct the processor to:
    identify at least two levels of output quality importance for output data bits of the approximation-aware encoding algorithm;
    encode data into the output data bits; and
    partition the output data bits according to their identified output quality importance level for storing in corresponding appropriate memory regions having different error characteristics, wherein the instructions that direct the processor to identify at least two levels of output quality importance, direct the processor to:
    convert pixels of an image from space domain to frequency domain; and
    assign coefficients that encode low frequency components to an importance attribute indicating high sensitivity to errors and assign coefficients that encode high frequency components to an importance attribute indicating lower sensitivity to errors.

11. The media of claim 10, wherein the instructions that direct the processor to assign coefficients that encode low frequency components to an importance attribute indicating high sensitivity to errors, assign coefficients that encode high frequency components to an importance attribute indicating lower sensitivity to errors, and encode the data into the output data bits comprise instructions that direct the processor to:
    gather frequency coefficients of similar frequency into a vector so that the frequency coefficients falling within a relatively low frequency coefficient range are clustered in beginning of the vector and the frequency coefficients falling within a relatively high frequency coefficient range are clustered towards the end of the vector with the frequency coefficients falling within a relatively intermediate frequency coefficient range being clustered in between;
    divide the vector into macroblocks; and
    perform entropy encoding of the macroblocks to generate encoded macroblocks comprising control bits, run-length bits, and appended refinement bits.

12. The media of claim 11, wherein the control bits and the run-length bits of a header and the first macroblock are assigned to the importance attribute indicating the higher sensitivity to errors; the control bits and the run-length bits of the macroblocks other than the first macroblock are assigned to the importance attribute indicating an intermediate sensitivity to errors; and wherein the appended refinement bits are assigned to the importance attribute indicating the lower sensitivity to errors.

13. The media of claim 10, further comprising instructions stored thereon that, when executed by the processor, direct the processor to:
    indicate frequency of particular bit patterns for the approximation-aware algorithm.

14. A system comprising:
    a processing system;
    one or more computer readable storage media, the one or more computer readable storage media comprising at least one approximate storage;
    an operating or file system stored on at least one of the one or more computer readable storage media that when executed by the processing system, directs the processing system to:
    assign a block of encoded data to a memory address or a particular region of the at least one approximate storage based at least according to an importance attribute indicating an error rate tolerance of the block of encoded data, each block of encoded data encoding frequency coefficient components of similar frequency such that all low frequency coefficient components are grouped together in separate blocks from the high frequency coefficient components.

15. The system of claim 14, wherein the operating or file system further directs the processing system to:
    specify a memory configuration for the approximate storage.

16. The system of claim 15, wherein instructions to specify a memory configuration for the approximate storage, direct the processing system to:
    provide threshold levels to perform a biasing of value ranges for a cell in the particular region according to an application type of an application from which the block of encoded data is received.

17. The system of claim 15, wherein instructions to specify a memory configuration for the approximate storage, direct the processing system to:
    provide an indication of a level of error correction for a cell in the particular region based on the importance attribute.

18. The system of claim 14, wherein instructions to assign the block of encoded data to the memory address or the particular region of the at least one approximate storage direct the processing system to write a flag indicating a level of precision associated with the block of encoded data.

19. The system of claim 14, wherein the operating or file system further directs the processing system to:
    provide an application programming interface for an approximation-aware application to indicate the importance attribute of data to be stored.

* * * * *